United States Patent [19]
McBride

[11] Patent Number: 6,077,717
[45] Date of Patent: Jun. 20, 2000

[54] SYSTEM AND METHOD FOR DETECTING NOR GATES AND NAND GATES

[75] Inventor: John G McBride, Ft Collins, Colo.

[73] Assignee: Hewlett-Packard Company, Palo Alto, Calif.

[21] Appl. No.: 09/237,425

[22] Filed: Jan. 26, 1999

[51] Int. Cl.[7] .................................................. H01L 21/00
[52] U.S. Cl. .............................................................. 438/10
[58] Field of Search ......................... 438/10, 5–9, 11–13, 438/14, 17, 800

[56] References Cited

U.S. PATENT DOCUMENTS

| | | | |
|---|---|---|---|
| 5,210,699 | 5/1993 | Harrington | 364/488 |
| 5,696,771 | 5/1996 | Beausang et al. | 371/22.3 |
| 5,889,685 | 3/1999 | Ramachandran | 364/578 |

*Primary Examiner*—Charles Bowers
*Assistant Examiner*—Craig Thompson

[57] ABSTRACT

A method is provided for identifying a NOR gate from a netlist. The method operates by first identifying at least one static gate output node, and then, for that at least one static gate output node, evaluating all channel-connected field effect transistors (FETs) that are electrically connected to the at least one static gate output node to ensure that: (i) no PFET (p-channel FET) that is channel connected to the at least one static gate output node is directly connected to VDD, (ii) all NFETs (n-channel FETs) that are channel connected to drive the at least one static gate output node are directly connected to ground, and (iii) at least one PFET and at least one NFET are channel connected to the at least one output node. A method is also provided for identifying a NAND gate from a netlist by identifying at least one static gate output node, then, for the at least one static gate output node, evaluating all channel-connected field effect transistors (FETs) that are electrically connected to the at least one static gate output node to ensure that: (i) all PFETs (p-channel FET) that are channel connected to drive the at least one static gate output node are directly connected to VDD, (ii) no NFETs (n-channel FETs) that are channel connected to the at least one static gate output node are directly connected to ground, and (iii) at least one PFET and at least one NFET are channel connected to the at least one output node.

14 Claims, 7 Drawing Sheets

6,077,717

SYSTEM AND METHOD FOR DETECTING NOR GATES AND NAND GATES

BACKGROUND OF THE INVENTION

1. Field of the Invention

The present invention generally relates to computer-aided circuit design systems, and more particularly to a system and method for evaluating a netlist to detect NOR and NAND gates.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator, A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or other circuit components. More specifically, there is often a need to identify gates such as NAND gates and NOR gates from a transistor level circuit design, in order to verify that certain design criteria have not been violated. By way of particular example, it is sometimes desirable to insure that the PFET (P-channel Field Effect Transistor) to NFET (N-channel Field Effect Transistor) transistor width ratio is within a certain predefined range for certain gates (e.g., NOR gates and NAND gates). Before making such a comparison or determination, however, the NOR and NAND gates must first be identified.

Accordingly, there is a heretofore unaddressed need to provide a design tool that evaluates a netlist or other electronic file representative of an electronic circuit to identify NAND gates and NOR gates.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a method for identifying NOR gates and NAND gates from a netlist. In accordance with one aspect of the invention a method is provided for identifying a NOR gate from a netlist. The method operates by first identifying at least one static gate output node, and then, for that at least one static gate output node, evaluating all channel-connected field effect transistors (FETs) that are electrically connected to the at least one static gate output node to ensure that: (i) no PFET (p-channel FET) that is channel connected to the at least one static gate output node is directly connected to VDD, (ii) all NFETs (n-channel FETs) that are channel connected to the at least one static gate output node are directly connected to ground, and (iii) at least one PFET and at least one NFET are channel connected to the at least one output node.

In accordance with another aspect of the invention, a method is provided for identifying a NAND gate from a netlist. In accordance with this aspect, the method operates to first identify at least one static gate output node. Thereafter, the method operates to, for the at least one static gate output node, evaluate all channel-connected field effect transistors (FETs) that are electrically connected to the at least one static gate output node to ensure that: (i) PFET (p-channel FET) that are channel connected to the at least one static gate output node are directly connected to VDD, (ii) no NFETs (n-channel FETs) that are channel connected to the at least one static gate output node are directly connected to ground, and (iii) at least one PFET and at least one NFET are channel connected to the at least one output node.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
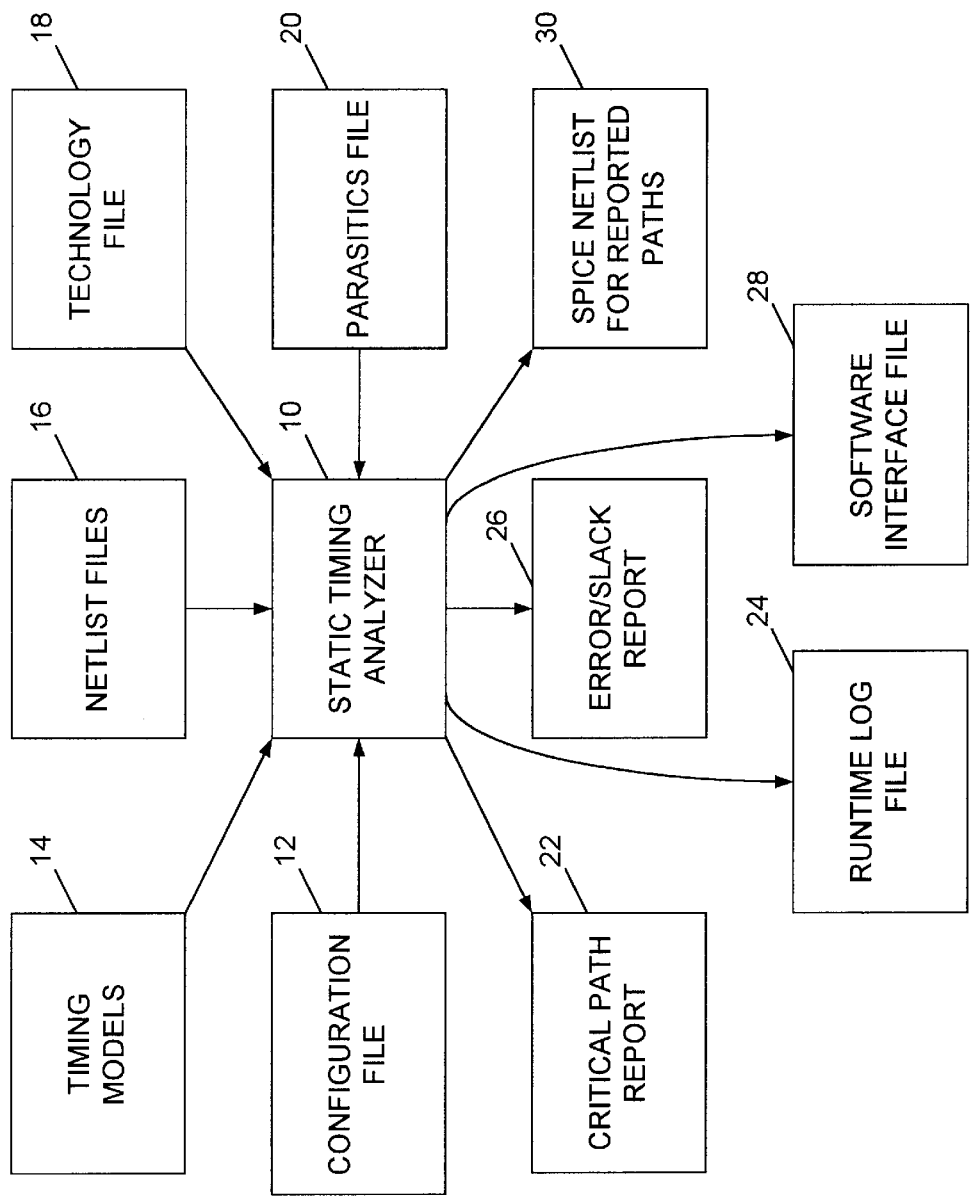
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as Static Timing Analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitics file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention.

In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations. The static timing analyzer 10 may make its internal netlist or database available to the electrical rules checker 100, which in turn may generate a binary file output 106

The electrical rules checker 100 program of the present invention is preferably configured to operate on an output of the static timing analyzer 10. In this regard, the static timing analyzer may be configured to generate an output netlist database, which the electrical rules checker of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. A portion of the electrical rules checker program 100 of the preferred embodiment of the present invention operates to identify NOR gates and NAND gates within an integrated circuit design.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker of the present invention provides an excellent mechanism for double-checking designs and design layouts.

Figure 2:
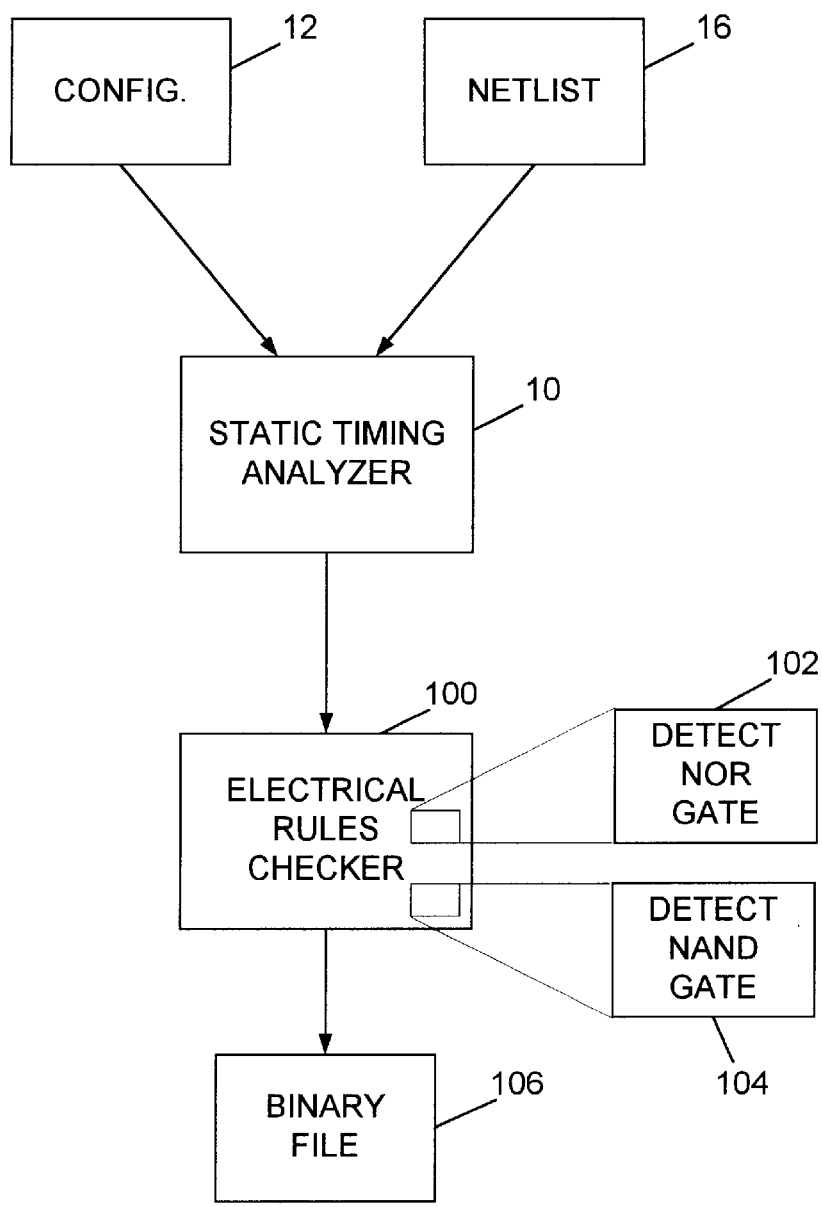
FIG. 2 is a block diagram illustrating the orientation of the electrical rules checking method of the present invention, in relation to an existing static timing analyzer.

In keeping with the description of FIG. 2, the electrical rules checker 100 of the present invention may generate an output binary file 106, which may ultimately be used in subsequent executions of the electrical rules checker program 100.

Figure 3A:
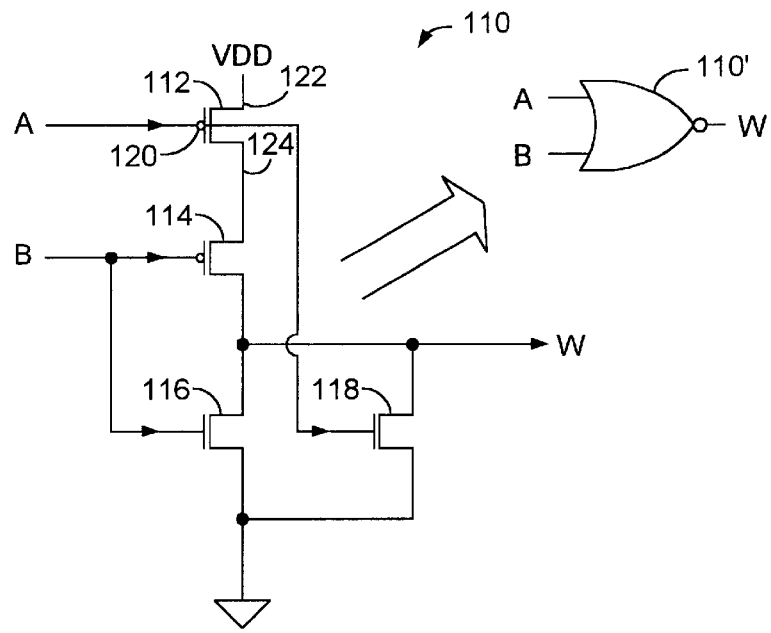
FIG. 3A is a schematic diagram of an exemplary two input NOR gate.

Having described certain environmental and other background system information, the discussion will now be directed toward the inventive aspects of the present invention. In this regard, one aspect of the present invention is to provide a method for detecting a NOR gates (or detecting all NOR gates) from a netlist file. Referring to FIG. 3A, an exemplary circuit 110 is shown illustrating a two input NOR gate having inputs A and B and an output W. Although there may be varying circuit constructs for fabricating a NOR gate, the exemplary structure for a two input NOR gate comprises four FETs 112, 114, 116, and 118. FETs 112 and 114 are P-type FETs, represented with a bubble (e.g., 120) on the gate node of the FET. FETs 116 and 118 are N-type FETs, which have no representative bubble on the gate nodes. Also illustrated in FIG. 3A is a higher-level logical symbol 110' often used by circuit designers in schematic capture programs at a higher-functional level. As illustrated, the first NOR gate input A is directly connected to the gate nodes of PFET 112 and NFET 118. The second NOR gate input B is directly connected to the gate nodes of PFET 114 and NFET 116. Further, the PFETs 112 and 114 are series connected, while the NFETs 116 and 118 are connected in parallel. In this respect, the channel nodes of the PFETs 112 and 114 are series connected, while the channel nodes of the NFETs 116 and 118 are connected in parallel. More specifically, each FET (e.g., 112) comprises three nodes—a source node 122, a gate node 120, and a drain node 124. As is known, the source node 122 and drain node 124 are also referred to as the channel nodes, insofar as the channel is defined as extending between these two nodes.

Figure 3B:
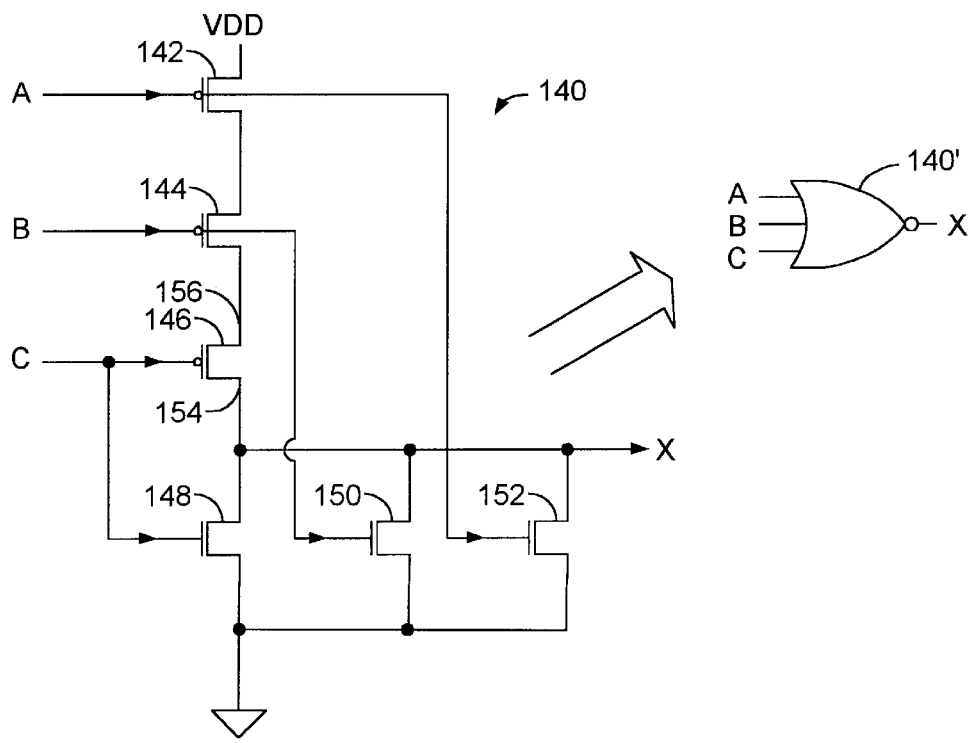
FIG. 3B is a schematic diagram of an exemplary three input NOR gate.

Reference is now made briefly to FIG. 3B, which illustrates a similar circuit configuration 140, but in the context of a three input NOR gate. The three input NOR gate has three input signals A, B, and C, and one output signal X. In its illustrative form, the schematic diagram 140 for a three input NOR gate comprises three PFETs 142, 144, and 146, and three NFETs 148, 150, and 152. As in the case of the two input NOR gate, the PFETs 142, 144, and 146 of the three input NOR gate are series connected, while the NFETs 148, 150, and 152 are connected in parallel. The first input A is directly connected to the gate nodes of PFET 142 and NFET 152. The second input B is directly connected to the gate nodes of PFET 144 and NFET 150. Finally, the third input C is directly connected to the gate node of PFET 146 and NFET 148. Furthermore, one channel node (the drain node in the illustrated embodiment) of each NFET device is directly connected to ground. The opposite channel node (the source node in the illustrated embodiment) of each NFET device 148, 150, and 152 is directly connected to the output X of this particular static gate.

As will be further described below, the method of the present invention identifies NOR gates from a netlist file. The inventive method identifies NOR gates having two inputs, three inputs, or even more inputs. Indeed, as will be appreciated from the brief discussion above, NOR gates having additional inputs can be constructed simply by adding additional series-connected PFETs, and NFETs connected in parallel. The preferred embodiment of the inventive method identifies NOR gates by performing at least the following steps: (1) identifying the output node of a static gate; (2) verifying that none of the PFET devices, electrically connected at a channel node to the output node of the static gate, is directly connected to VDD; and (3) verifying that all NFET devices, electrically connected to the output node of the static gate, are directly connected to ground. By way of definition, for purposes of this patent and the claim construction herein, the present invention ignores any gate nodes which may be directly connected to the output node of a static gate. Thus, only channel nodes (e.g., sources and drains) are considered. When evaluating whether a PFET is directly connected to VDD, the present invention evaluates the channel node opposite the channel node connected to the output node of the static gate.

By way of specific illustration, consider the PFET 146 of FIG. 3B. The drain node 154 is electrically connected to the output node X of the static gate 140. The node 146 opposite the drain node 154 is the source node. It can be seen from FIG. 3B that the source node 156 is not directly connected to VDD, but rather is connected to the drain node of PFET 144. Indeed, it can be appreciated that the PFET directly connected to the output node of the static gate of a NOR gate configuration will also be separated from VDD by at least one FET. For example, in the two input NOR gate of FIG. 3A, PFET 114 is separated from VDD by PFET 112. In the three input NOR gate of FIG. 3B, PFET 146 is separated by VDD by two PFETs, PFETs 142 and 144. In NOR gates having additional inputs, there will be an even greater separation between the PFET electrically connected to the output node and VDD.

Similarly, the method of the present invention ensures that all NFETs are directly connected to ground. In this regard, and as in the case of the PFETs described above, all gate nodes connected to the output node of the static gate are disregarded. Therefore, only channel nodes are considered. For each channel node electrically connected (directly) to the output node of the static gate, the method of the present invention will evaluate the opposite channel node to ensure that it is electrically connected to ground. For example, consider NFET 150 of FIG. 3B. Its drain node is directly connected to the output node X of the static gate 140. The source node opposite the drain node is electrically connected to ground. Again, it will be appreciated that larger NOR gates having additional inputs are constructed simply by adding additional NFETs in parallel (and PFETs in series). Therefore, each NFET device of a NOR gate will be directly connected to ground.

Figure 4A:
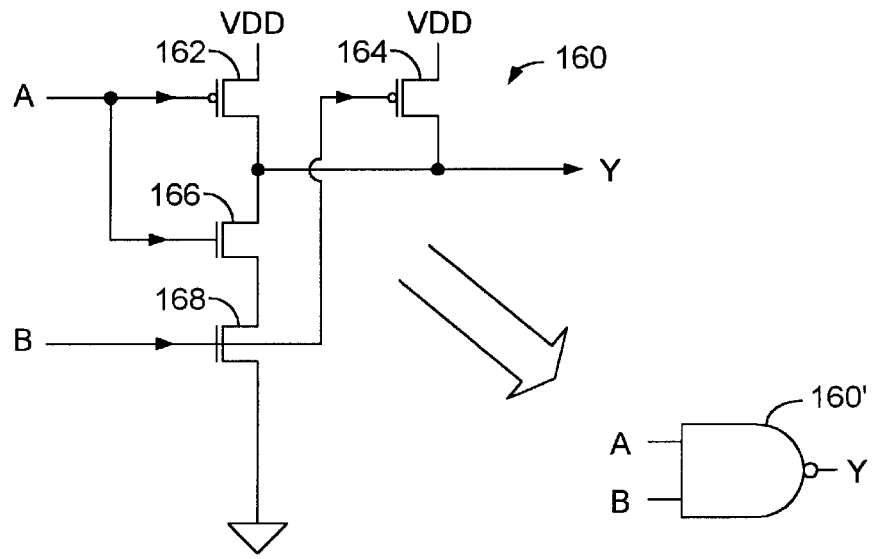
FIG. 4A is a schematic diagram of an exemplary two input NAND gate.
Figure 4B:
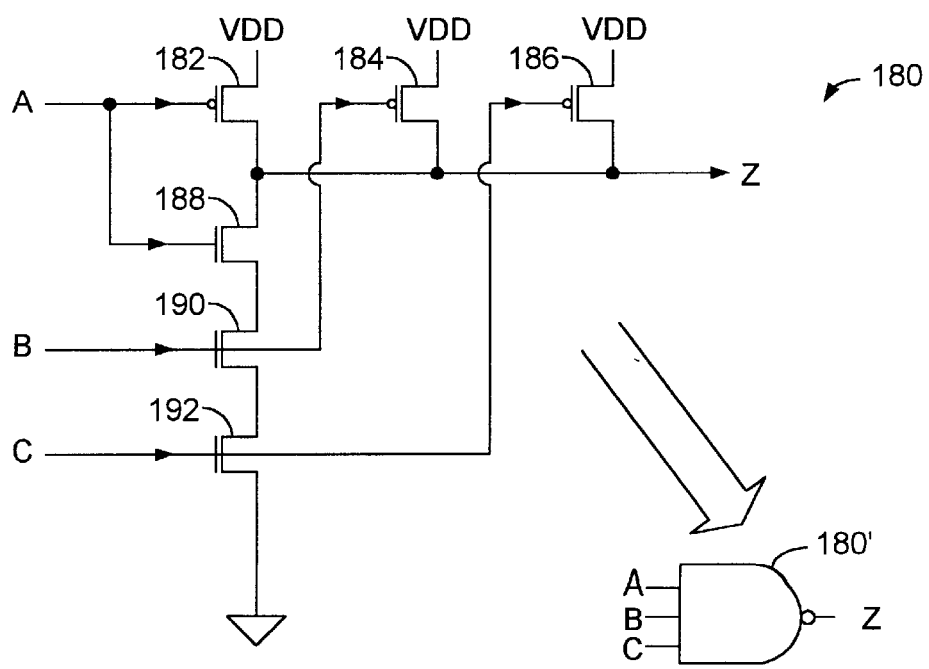
FIG. 4B is a schematic diagram of an exemplary three input NAND gate.

In accordance with another aspect of the present invention, a method is provided for detecting NAND gates within a netlist file. Like the NOR gates illustrated by the schematic diagrams of FIGS. 3A and 3B, FIGS. 4A and 4B show schematic diagrams illustrating exemplary NAND gates. More particularly, FIG. 4A illustrates the construct of a two input NAND gate, while FIG. 4B illustrates the construct of a three input NAND gate. Referring first to FIG. 4A, a two input NAND gate 160 is illustrated. The exemplary construct of this NAND gate is formed by two PFETs 162 and 164 being connected in parallel, and two NFETs 166 and 168 being series connected. More specifically, a first input A for the two input NAND gate is directly connected to the gate nodes of PFET 162 and the NFET 166. The second input B of the two input NAND gate 160 is directly connected to the gate nodes of PFET 164 and NFET 168. Each of the PFET devices 162 and 164 are channel connected with the output node Y of the gate 160. In contrast, however the NFET devices that are channel connected to the output node are series connected. As illustrated by the pair of NFET devices illustrate in the figure, the series connection ensures that the NFET directly connected to the output node is not connected to Ground.

Referring to FIG. 4B, a three input NAND gate 180 is formed by the addition of an extra PFET and an extra NFET. Specifically, a three input NAND gate is formed with three PFETs 182, 184, and 186 being connected in parallel, and each being channel connected to the output node Z of the device. Likewise, a three input NAND gate 180 includes the three NFETs 188, 190, and 192 being series connected with each other, and only one (e.g., 188) being channel connected to the output node Z. Each input is electrically connected to the gate node of one of the PFETs and one of the NFETs. In the illustrated embodiment, input A is electrically connected to the gate nodes of PFET 182 and NFET 188. Input B is electrically connected to the gate node of PFET 184 and NFET 190. Finally, input C is electrically connected to the gate nodes of PFET 186 and NFET 192. The method of this aspect of the present invention detects NAND gates (of any number of inputs) by first detecting output nodes of a static gate, and then for that output node verifying that each and every PFET device that is channel connected to the output node is directly connected to VDD. It further verifies that no NFET device that is channel connected to the output node is directly connected to ground. When this test is satisfied, the method of the present invention recognizes the given output node to be that of a NAND gate.

Figure 5:
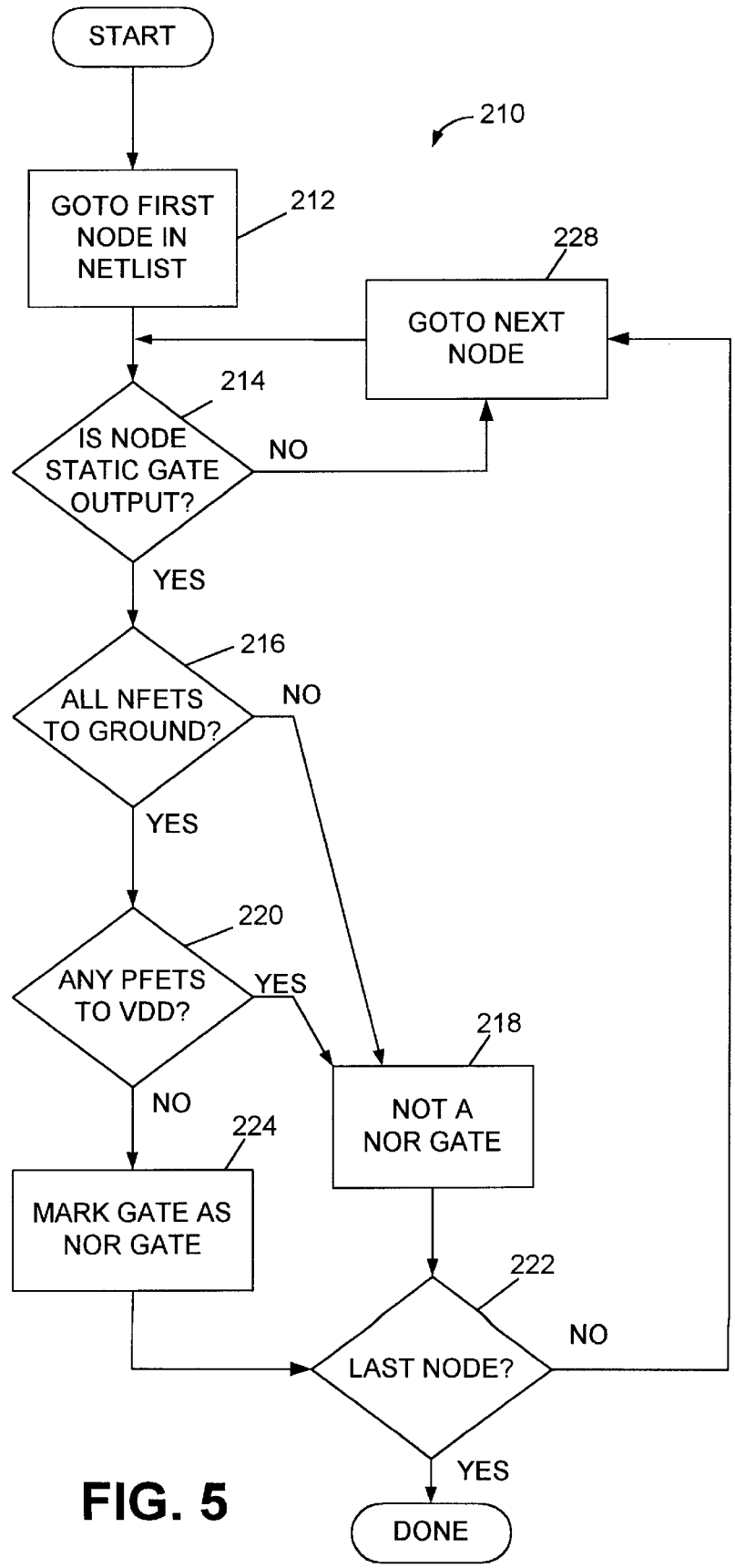
FIG. 5 is a flowchart illustrating one possible implementation of a method of the present invention as used to detect NOR gates.

Reference is now made to FIG. 5 which is a flow chart 210 illustrating in more detail the steps of one aspect of the present invention, which detects NOR gates from a netlist file. In short, the invention proceeds through a netlist, node by node, evaluting each node to determine first whether a given node is an output node of a static gate. If so, the invention will then determine whether the gate is a NOR gate. In accordance with this aspect of the invention, a first step 212 proceeds to the first node in the netlist The invention then determines whether the current node is an output node of a static gate (step 214).

As will be appreciated by those skilled in the art, a static gate may be better defined by what it is not, as opposed to providing an affirmative definition of what it is. In this regard, a static gate is not a dynamic gate; it is not a latch, it is not a RAM cell, it is not a ROM cell, it does not have a clock signal input, it is not driven by a pass FET, it is not a FET capacitor, and, it does not follow within one gate of a dynamic gate. As is known, a FET capacitor is a FET having by the source and drain nodes tied to Ground, and the gate node is driven by a signal or by VDD. In addition to the foregoing, in determining whether a given netlist node is a static gate output node, the program of the present invention ensures that there is at least one PFET channel-connected to the node, and at least one NFET channel-connected to the node. If not, then the node is determined not to be a static gate output node, and the gate is determined not to be either a NOR gate nor a NAND gate.

Assuming that the node is an output node of a static gate, the method then proceeds to examine the output node. In evaluating the current output node, the method proceeds to determine whether all NFET devices that are channel connected to the output node are directly connected to Ground (step 216). More specifically, the preferred embodiment of the present invention first evaluates the direction flags of the NFET and performs the above evaluations only on NFET devices that are driving the node, and not NFETS being driven by the node. As will be appreciated by persons skilled in the art, the direction flags may be set by Pathmill, or otherwise defined in a manner that may be utilized by the system of the preferred embodiment.

If no NFETS that are driving the node are directly connected to Ground, the method concludes that the gate is not a NOR gate (step 218). If, however, all the NFET devices are directly connected to ground, then the method proceeds to determine whether any of the PFET devices are channel connected to the output node are directly connected to VDD (step 220). If any of the PFET devices are, in fact, directly connected to VDD, then the method concludes that the device is not a NOR gate (step 218). If, however, none of the PFET devices are directly connected to VDD, then the method of the present invention concludes that the gate in question is in fact a NOR gate. In accordance with one embodiment of the invention, the particular gate may be marked as a NOR gate, in, for example, a data structure (step 224). The method may then evaluate (step 222) whether the gate just evaluated was the node of the netlist. If so, then the routine is finished. If not, however, then the method may increment a pointer or otherwise go to the next netlist node (step 228), before returning to step 214 and repeating the above-described evaluations for the next node.

Figure 6:
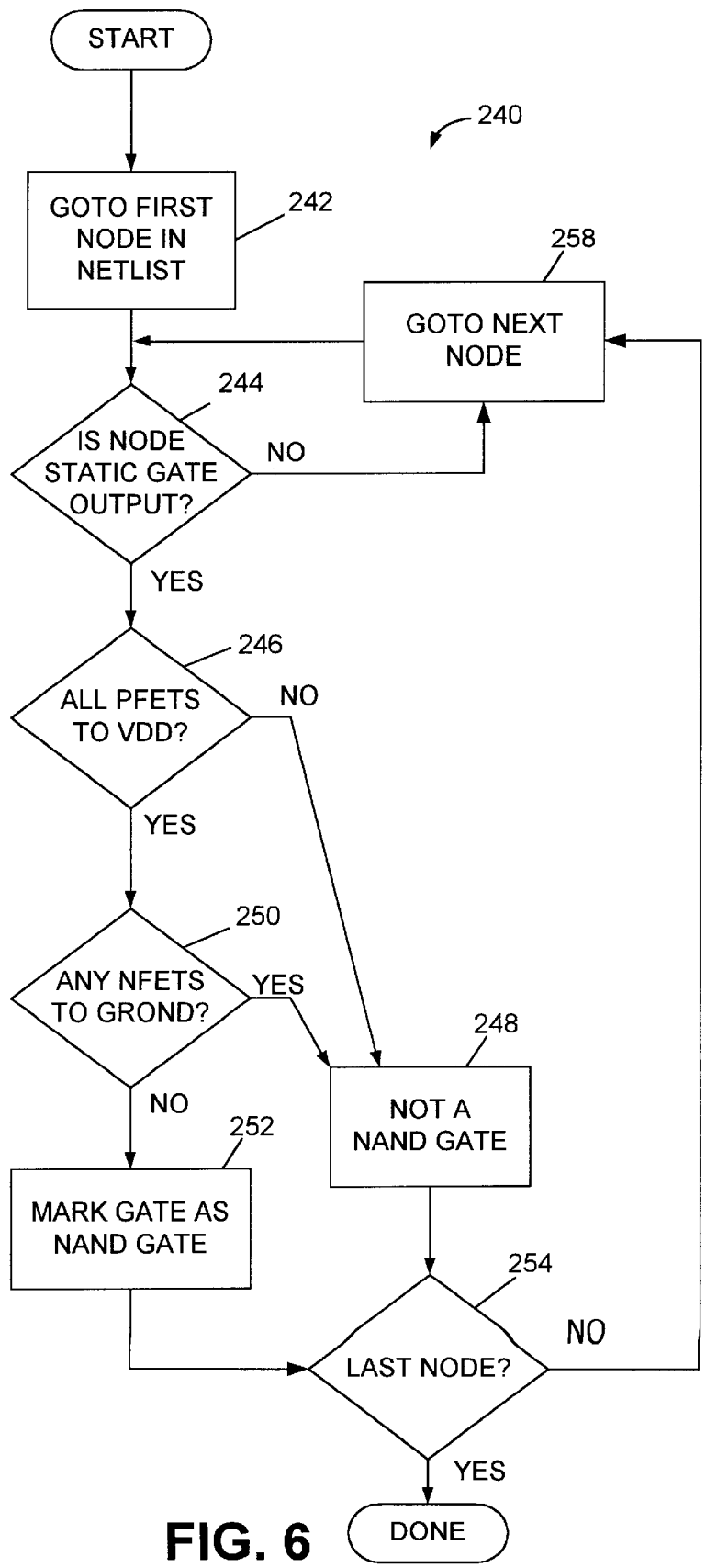
FIG. 6 if a flowchart illustrating one possible implementation of a method of the present inventing as used to detect NAND gates.

As described above in connection with FIGS. 4A and 4B, another aspect of the present invention identifies all NAND gates in a netlist file. FIG. 6 illustrates a flow chart 240 depicting certain steps for carrying out this evaluation in accordance with one embodiment of the invention. As described in connection with FIG. 5, a first step is to proceed to the first node of the netlist (step 242). This node is then evaluated to determine whether it is an output node of a static gate (step 244). If so, then the method proceeds to determine whether all PFET devices channel-connected to the output nodes are directly connected to VDD (step 246). As done in the process of detecting NOR gates, the preferred embodiment ensures that only those PFETs that are channel-connected to the node, and which are configured (e.g., direction flag) to drive the node, are directly connected to VDD. If not, the method concludes that the gate is not a NAND gate (step 248). If, however, all the PFET devices that are channel connected to the output node are directly connected to VDD, then the method proceeds to determine whether any of the NFET devices that are channel connected to the output node are directly connected to ground (step 250). If any of the NFET devices are, in fact, connected to ground, then the method concludes that the gate is not an NAND gate (step 248). If, however, none of the NFET devices are directly connected to ground, then the method concludes that the gate is in fact a NAND gate (step 252), and the gate may be marked accordingly. The method may then determine whether the node just analyzed was the last node of the input netlist (step 254). If so, the routine is done. If, however, there are additional static gates in the netlist, then the system may update a pointer or otherwise proceed to the next node in the netlist (step 258), and return to perform the evaluations described above.

Figure 7:
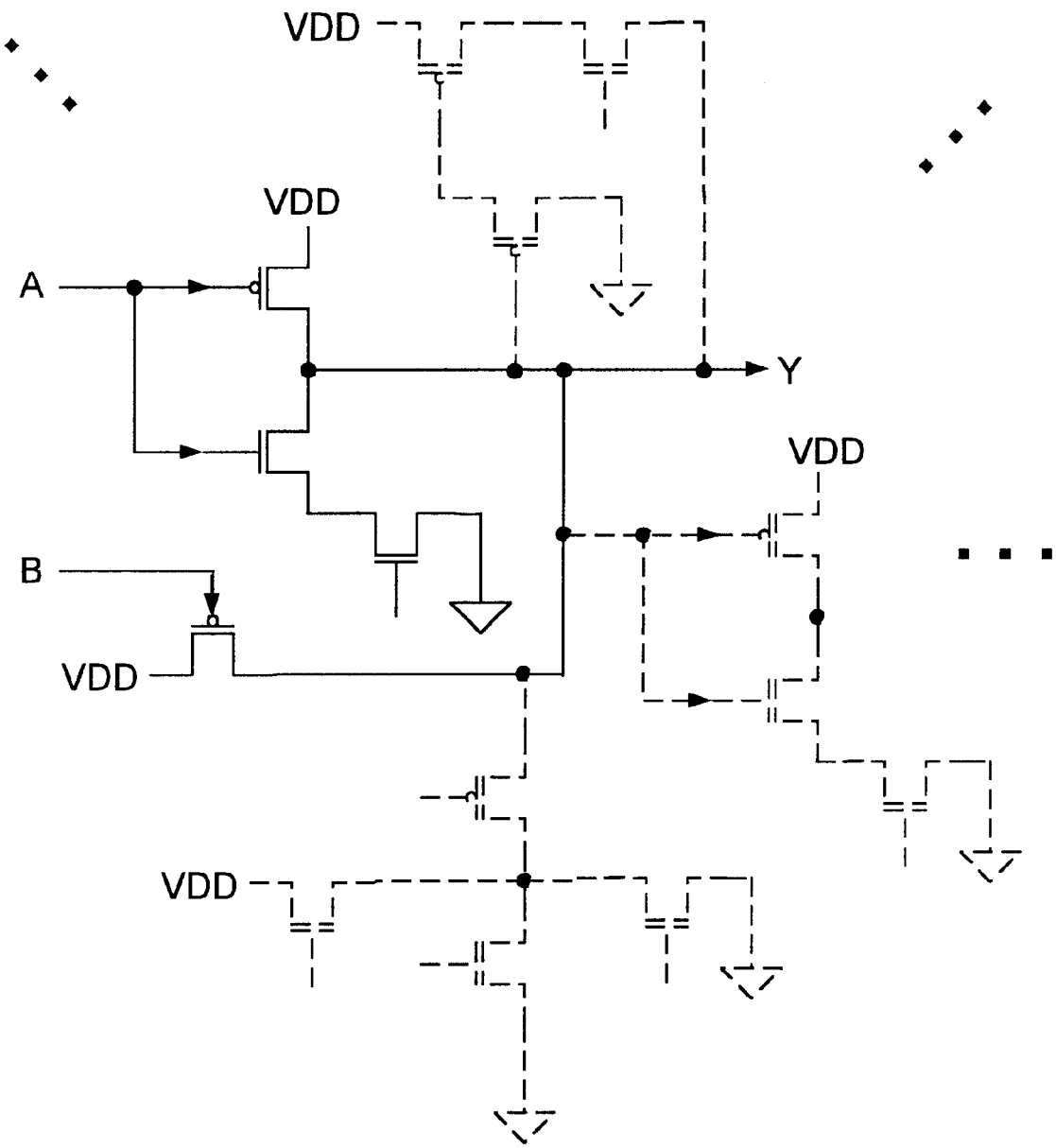
FIG. 7 is a schematic diagram illustrating a two input NAND gate integrated within additional circuitry.

FIGS. 3A, 3B, 4A, and 4B, described above presented exemplary schematic diagram presentations for NAND gates and NOR gates. It will be appreciated, however, that in the design phase of a relatively large circuit having many FET devices, that the circuits will rarely be presented in such exemplary form. Therefore, the value of the double checking aspect of the present invention becomes significantly enhanced. For example, consider briefly FIG. 7, which illustrates a two input NAND gate. As illustrated, the orientation and layout of the PFET and NFET devices are not the same as illustrated in FIG. 4A, but are illustrated in more practical or realistic fashion. In addition, other FET devices are interconnected around those forming the NAND gate. For simplification and illustration, the PFET and NFET devices forming the NAND gate are shown in solid line, while the remaining circuitry is shown in dash line. It should be appreciated that in the context of a much larger circuit, it would be rather difficult for a designer to readily identify the NAND gate in the context of the much larger circuit. Although a detailed evaluation and recitation is not necessary, it will be appreciated that the method of the present invention would readily recognize the FET devices as comprising a two input NAND gate by verifying that all of the PFET devices that are channel connected to the output node X are directly connected to VDD, while ensuring that none of the NFET devices that are channel connected to the output node X are directly connected to ground.

In should be appreciated that the flow chart of FIGS. 5 and 6 show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 5 and 6. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for identifying a NOR gate from a netlist file comprising the steps of:

identifying at least one static gate output node;

for the at least one static gate output node, evaluating all channel-connected field effect transistors (FETs) that are electrically connected to the at least one static gate output node to ensure that: (i) no PFET (p-channel FET) that is channel connected to the at least one static gate output node is directly connected to VDD, (ii) all NFETs (n-channel FETs) that are channel connected to drive the at least one static gate output node are directly connected to ground, and (iii) at least one PFET and at least one NFET are channel connected to drive the at least one output node.

2. The method as defined in claim 1, wherein the step of identifying at least one static gate output node is performed by evaluating all nodes in the netlist file, and excluding all nodes of non-static gates.

3. The method as defined in claim 2, wherein the step of excluding all non-static gates includes excluding at least all gates from the group consisting of: dynamic gates, latches, RAMs, gates having a clock input, complementary pass FETs, FET capacitors, and gates separated by a dynamic gate by less than one gate.

4. The method as defined in claim 1, wherein the netlist is a flat netlist file, having no gate boundary demarcations.

5. The method as defined in claim 1, wherein a PFET is considered to be directly connected to VDD if the channel connection opposite the at least one node is directly connected to VDD, wherein the channel connection opposite the at least one node is a FET drain if the channel connection connected to the at least one node is a FET source, and the channel connection opposite the at least one node is a FET source if the channel connection connected to the at least one node is a FET drain.

6. The method as defined in claim 1, wherein a NFET is considered to be directly connected to ground if the channel connection opposite the at least one node is directly connected to ground, wherein the channel connection opposite the at least one node is a FET drain if the channel connection connected to the at least one node is a FET source, and the channel connection opposite the at least one node is a FET source if the channel connection connected to the at least one node is a FET drain.

7. The method as defined in claim 1, wherein all NOR gates in the netlist file are identified by performing the identifying and evaluating steps for all static gate output nodes in the netlist file.

8. A method for identifying a NAND gate from a netlist file comprising the steps of:

identifying at least one static gate output node;

for the at least one static gate output node, evaluating all channel-connected field effect transistors (FETs) that are electrically connected to the at least one static gate output node to ensure that: (i) all PFETs (p-channel FET) that are channel connected to drive the at least one static gate output node are directly connected to VDD, (ii) no NFETs (n-channel FETs) that are channel connected to the at least one static gate output node are directly connected to ground, and (iii) at least one PFET and at least one NFET are channel connected to drive the at least one output node.

9. The method as defined in claim 8, wherein the step of identifying at least one static gate output node is performed by evaluating all nodes in the netlist file, and excluding all nodes of non-static gates.

10. The method as defined in claim 9, wherein the step of excluding all non-static gates includes excluding at least all gates from the group consisting of: dynamic gates, latches, RAMs, gates having a clock input, complementary pass-FETs, FET capacitors, and gates separated by a dynamic gate by less than one gate.

11. The method as defined in claim 8, wherein the netlist is a flat netlist file, having no gate boundary demarcations.

12. The method as defined in claim 8, wherein a PFET is considered to be directly connected to VDD if the channel connection opposite the at least one node is directly connected to VDD, wherein the channel connection opposite the at least one node is a FET drain if the channel connection connected to the at least one node is a FET source, and the channel connection opposite the at least one node is a FET source if the channel connection connected to the at least one node is a FET drain.

13. The method as defined in claim 8, wherein a NFET is considered to be directly connected to ground if the channel connection opposite the at least one node is directly connected to ground, wherein the channel connection opposite the at least one node is a FET drain if the channel connection connected to the at least one node is a FET source, and the channel connection opposite the at least one node is a FET source if the channel connection connected to the at least one node is a PET drain.

14. The method as defined in claim 8, wherein all NAND gates in the netlist file are identified by performing the identifying and evaluating steps for all static gate output nodes in the netlist file.

* * * * *

UNITED STATES PATENT AND TRADEMARK OFFICE
CERTIFICATE OF CORRECTION

PATENT NO.   : 6,077,717
DATED        : June 20, 2000
INVENTOR(S)  : John G. McBride It is certified that error appears in the above-identified patent and that said Letters Patent is hereby corrected as shown below:

Column 10,
Line 38, delete "pass-" and insert therefor -- pass --
Line 58, delete "PET" and insert therefor -- FET --

Signed and Sealed this

Fourth Day of June, 2002

Attest:

JAMES E. ROGAN
Attesting Officer   Director of the United States Patent and Trademark Office